United States Patent [19]

Barton et al.

[11] Patent Number: 4,812,213

[45] Date of Patent: Mar. 14, 1989

[54] PROCESS FOR THE MANUFACTURE OF MULTI-LAYER CIRCUITS WITH DYNAMIC FLEXING REGIONS AND THE FLEXIBLE CIRCUITS MADE THEREFROM

[75] Inventors: Carlos L. Barton, Brooklyn, Conn.; Adrienne Lindsay, Chandler; Samuel W. Henson, Mesa, both of Ariz.

[73] Assignee: Rogers Corporation, Rogers, Conn.

[21] Appl. No.: 190,890

[22] Filed: May 6, 1988

[51] Int. Cl.$^4$ .......................... C25D 5/02; C25D 5/56
[52] U.S. Cl. ...................................... 204/15; 204/38.4
[58] Field of Search ................. 204/15, 38.1, 38.4, 204/38.7

[56] References Cited

U.S. PATENT DOCUMENTS 4,626,462 12/1986 Kober ................................ 428/137

Primary Examiner—T. M. Tufariello
Attorney, Agent, or Firm—Fishman, Dionne & Cantor

[57] ABSTRACT

A multilayer through-hole contacted flexible circuit and method of manufacture thereof is presented having a laminar construction which is strictly symmetrical in the bending area; and which has no exposed adhesive. The flexible circuit is made by providing through-holes to a standard single sided laminate. Next, conductive material is vacuum deposited (e.g. sputtered or evaporated) into the through-holes and at the same time a conductive seed-layer is deposited on the polymer side of the standard laminate. Plating resist is applied to both sides of the material and the seed-layer side of the material is patterned such that circuit traces, pads, and through-holes can be electroplated with additional copper. The plating resist is stripped and the very thin layer of copper in the non-conductive areas is flash etched to produce semi-additive circuit features on the seed-layer side. Etch resist is then applied to both sides of the material and circuit patterns fabricated on the foil-side of the material using standard substractive processing techniques. A cover film coated with adhesive is then provided over the exposed circuit patterns.

16 Claims, 4 Drawing Sheets

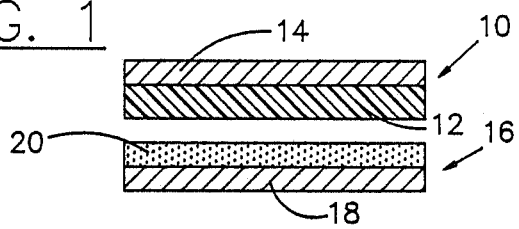
FIG. 1
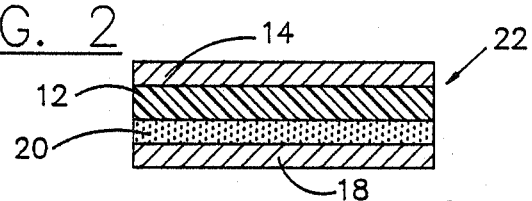
FIG. 2
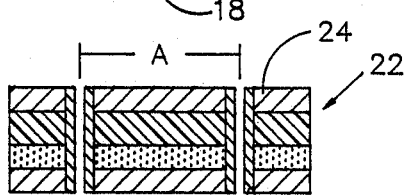
FIG. 3
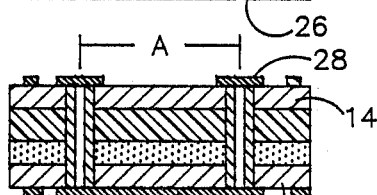
FIG. 4
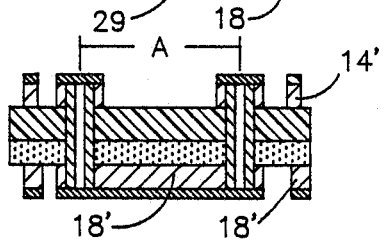
FIG. 5
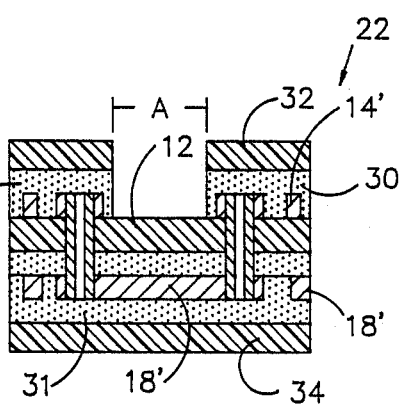
FIG. 6
FIG. 7
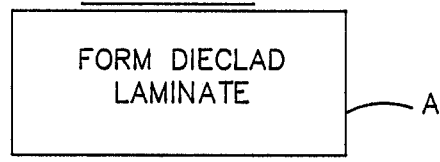
A — FORM DIECLAD LAMINATE
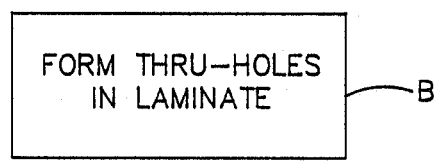
B — FORM THRU-HOLES IN LAMINATE
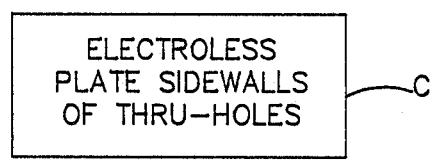
C — ELECTROLESS PLATE SIDEWALLS OF THRU-HOLES
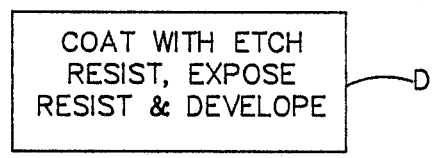
D — COAT WITH ETCH RESIST, EXPOSE RESIST & DEVELOPE
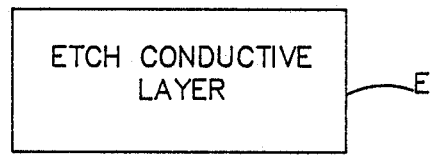
E — ETCH CONDUCTIVE LAYER
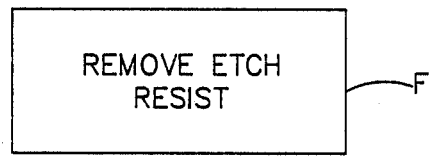
F — REMOVE ETCH RESIST
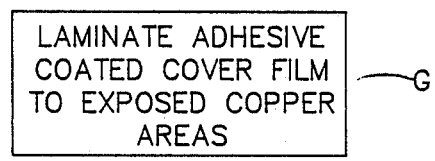
G — LAMINATE ADHESIVE COATED COVER FILM TO EXPOSED COPPER AREAS

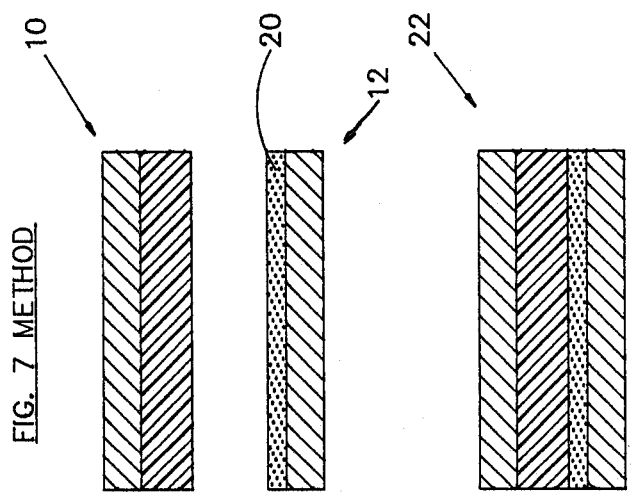
FIG. 7 METHOD
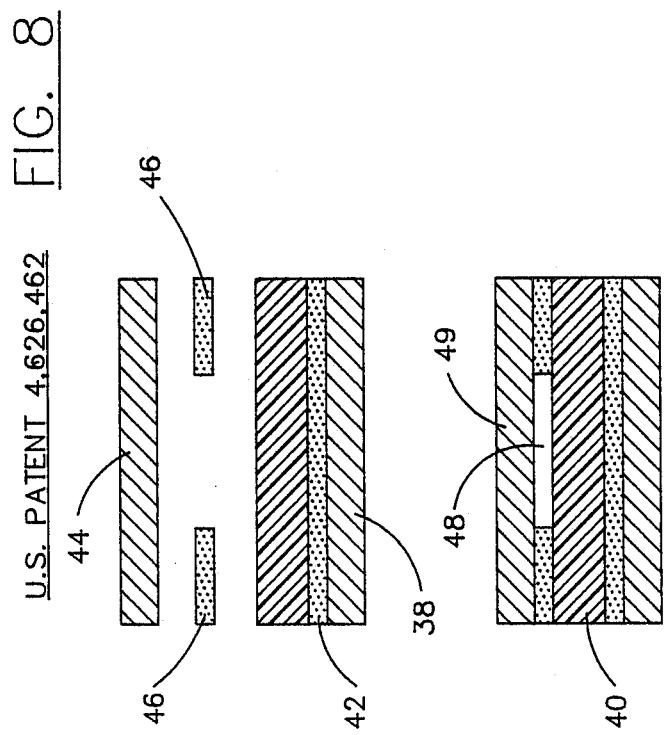
FIG. 8 U.S. PATENT 4,626,462

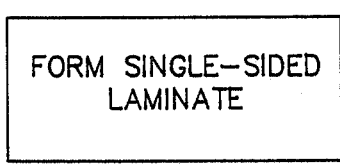
FIG. 18
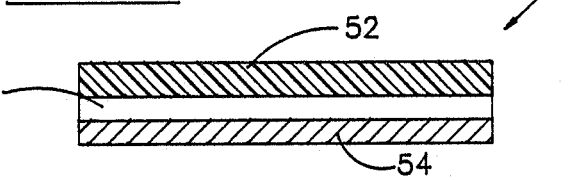
FIG. 9
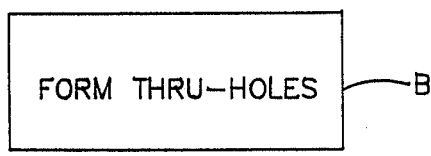
FORM SINGLE-SIDED LAMINATE — A
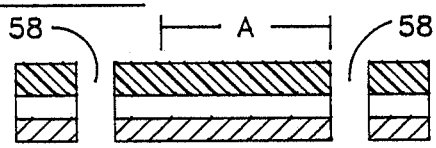
FIG. 10
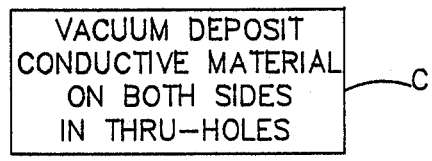
FORM THRU-HOLES — B
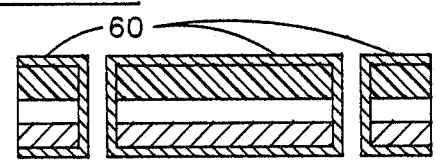
FIG. 11
VACUUM DEPOSIT CONDUCTIVE MATERIAL ON BOTH SIDES IN THRU-HOLES — C
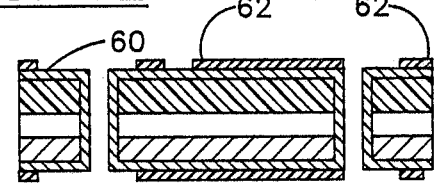
FIG. 12
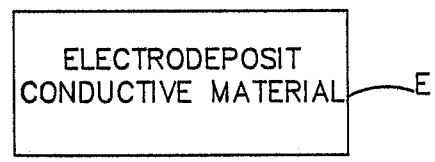
APPLY PHOTO RESIST IMAGE & DEVELOPE — D
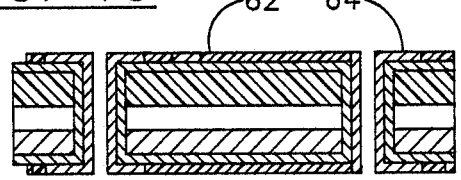
FIG. 13
ELECTRODEPOSIT CONDUCTIVE MATERIAL — E FIG. 19
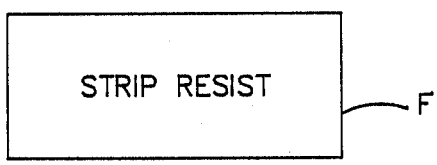
STRIP RESIST — F
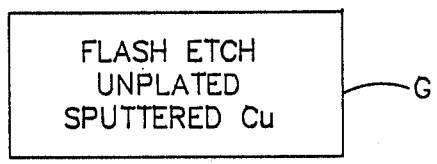
FLASH ETCH UNPLATED SPUTTERED Cu — G
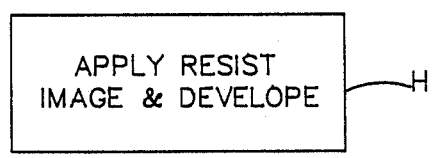
APPLY RESIST IMAGE & DEVELOPE — H
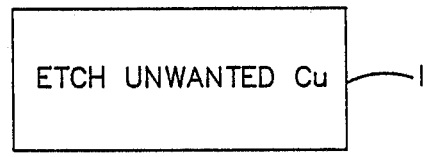
ETCH UNWANTED Cu — I
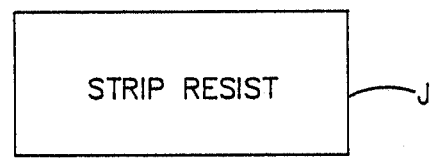
STRIP RESIST — J
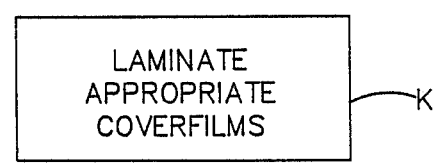
LAMINATE APPROPRIATE COVERFILMS — K
FIG. 14
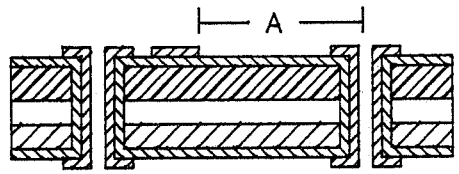
FIG. 15
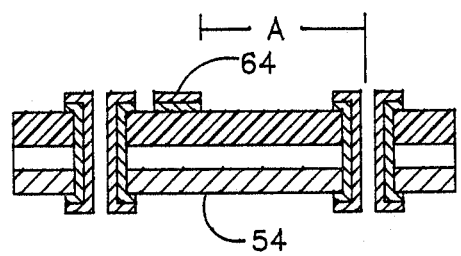
FIG. 16
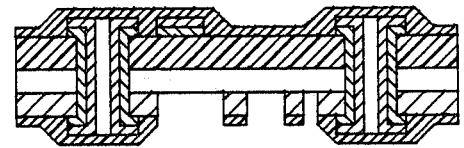
FIG. 17
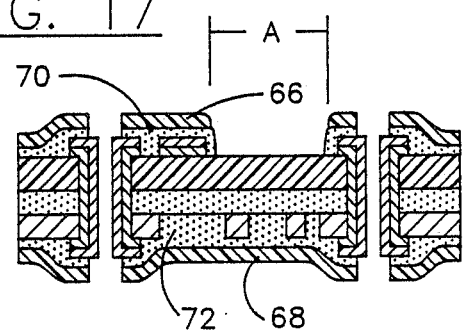

PROCESS FOR THE MANUFACTURE OF MULTI-LAYER CIRCUITS WITH DYNAMIC FLEXING REGIONS AND THE FLEXIBLE CIRCUITS MADE THEREFROM

BACKGROUND OF THE INVENTION

This invention relates to a process for the manufacture of through-hole contacted flexible circuit boards which are suited for high bending stresses and the circuit boards derived therefrom.

Flexible circuit elements are commonly used in electronic components that are subjected to high dynamic bending stresses, such as, for example, in disk storages and printers. These flexible circuit elements must have a smooth and extremely clean surface, in order to avoid disturbances of the electromechanical operation (of the disc drive or other electronic component) as the result of particles released from the flexible circuit board; particularly particles released from the adhesive materials used in manufacturing the flexible circuitry.

Circuit boards for high bending stresses which have two circuit layers with through-hole contacts located outside the bending area, are usually designed to be flexible on one side and to have carrier and covering films of equal thickness (symmetrical laminar construction). The base material used is a carrier film, made, for example, of polymide, with copper-laminated on both sides thereof. Generally, the copper layer or foil is attached to the carrier film by means of an adhesive layer. The formation of through-hole contacts and a conductive pattern (on the copper foil) is accomplished in a conventional manner by a substractive process (etching). As a result, in the bending area, the conducting paths (circuit pattern) are formed on only one side thereof, and the other side is completely etched away. The conductors are then provided with a protective covering film, of the same thickness as the carrier film.

Despite the apparent symmetrical construction of the above-described flexible circuits, the conducting paths thereon are not located in the transverse section of the laminate that remains "neutral" when subjected to bending stress, that is, the section that is neither subjected to tensile or compressive strains (the þneutral section"). In fact, the adhesive layer of the carrier film (which has been etched away) will produce an asymmetry, which acts to displace the neutral section into other transverse areas. In addition, as a result of the exposed adhesive, the circuit board is liable to accumulate dust and to be subjected to abrasion and thereby contaminate the electronic component.

U.S. Pat. No. 4,626,462 (all of the contents of which are fully incorporated herein by reference) attempts to solve the above-discussed problems by a through-hole contacted flexible circuit board for high bending stresses and method of manufacture thereof. In U.S. Pat. No. 4,626,462, a process is provided wherein through-hole contacted flexible circuit boards for high bending stresses can be manufactured with a strictly symmetrical laminar construction in the bending area. In that area, the conducting paths (circuit pattern) are located in the "neutral section" described above. Significantly, there are no exposed layers of adhesive in the bending area which could act as a contaminate.

U.S. Pat. No. 4,626,462 starts with a standard flex circuit material composed of copper foil adhesively secured to a polymeric film and then adds a second copper layer by selectively adhering copper foil to the polymeric film. The adhesive is used in only non-flexing regions of the circuit. A characteristic of the manufacturing technique is that during the process, there is an air gap (identified as 9 in FIG. 2 of U.S. Pat. No. 4,626,462) formed between the polymeric film and the second copper layer in the area containing the dynamic flexing section of the final product.

While the manufacturing process of U.S. Pat. No. 4,626,462 is suitable for its intended purposes, there is a need for improved methods of manufacturing multi-layer circuits with dynamic flexing regions.

SUMMARY OF THE INVENTION

In accordance with a first embodiment of the present invention, a diclad laminate is formed comprised of an adhesiveless flex circuit (e.g. conductive foil directly on non-conductive flexible carrier film) which is adhered to a second conductive layer using a suitable adhesive. Next, through-holes are formed in the laminate followed by electroless deposition of metal on the through-hole sidewalls. The laminate then undergoes conventional etching processing using photo resist followed by lamination thereof to an adhesive coated polymeric cover film over the exposed conductive areas so as to define a dynamic flex region in the area between the through-holes.

The method of the first embodiment of the present invention includes several advantages over the prior art method described in U.S. Pat. No. 4,626,462 including the deletion of both an adhesive layer and the necessity for an air gap or space.

In accordance with a second embodiment of the present invention, no diclad laminate is initially formed. Instead, through-holes are provided to a standard single sided laminate. Next, conductive material (copper) is vacuum deposited (e.g. by sputtering or evaporation techniques) into the through-holes and at the same time a conductive (copper) seed-layer (1,000–10,000 Å) is deposited on the polymer side of the standard laminate. Plating resist is applied to both sides of the material and the seed-layer side of the material is patterned such that circuit traces, pads, and through-holes can be electroplated with additional copper. The plating resist is stripped and the very thin layer (1–10,000 Å) of copper in the non-conductor areas is flash etched to produce semi-additive circuit features on the seed-layer side. Etch resist is then applied to both sides of the material and circuit patterns fabricated on the foil-side of the material using standard substractive processing techniques. Cover films coated with adhesive are then provided over the exposed circuit patterns.

The method of the second embodiment of the present invention has features and advantages relative to both the methods of U.S. Pat. No. 4,626,462 and the method of the first embodiment. For example, the second embodiment deletes both an adhesive layer and the air gap necessitated by the U.S. Pat. No. 4,626,462. In addition, the second embodiment eliminates those steps related to a lamination operation and eliminates the electroless deposition operation. The vacuum deposition process eliminates the maintenance and environmental concerns associated with electroless deposition and the adhesion of the vacuum deposited seed-layer is greater than that of the electroless plated seed-layer.

The above discussed and other features and advantages of the present invention will be appreciated by those skilled in the art from the following detailed description and drawings.

BRIEF DESCRIPTION OF THE DRAWINGS

Referring now to the drawings wherein like elements are numbered alike in the several FIGURES:

FIGS. 1-6 are cross sectional elevation views showing sequential steps of the flexible multilayer circuit formed in accordance with a first embodiment of the present invention;

FIG. 7 is a block diagram showing the process of FIGS. 1-6;

FIG. 8 depicts cross sectional elevation views comparing the method of FIGS. 1-6 to the method of U.S. Pat. No. 4,626,462;

FIGS. 9-17 are cross sectional elevation views showing sequential steps of the flexible multi layer circuit formed in accordance with a second embodiment of the present invention; and FIGS. 18 and 19 are block diagrams showing the method of FIGS. 9-17.

DESCRIPTION OF THE PREFERRED EMBODIMENT

FIGS. 1-6 and 7 describe a method in accordance with the first embodiment of the present invention. Referring first to FIG. 1, a diclad laminate (shown at 22 in FIG. 2) is initially formed (Step A) from a first adhesiveless laminate identified at 10 and comprised of a sheet of flexible polymeric film 12 having conductive material 14 thereon. The polymeric film may be comprised of any suitable film such as polyimide and the conductive material 14 may be comprised of any suitable conductor such as copper. It will be appreciated that the adhesiveless laminate may be formed from many different known methods including at least the following four methods:

1. Cast a polymeric film from solution onto copper foil, dry, and then cure if necessary.
2. Bond a thermoplastic polymer film to copper foil with heat and pressure.
3. Deposit a conductive (metallic) seed-layer directly on the polymer film using vacuum techniques (evaporation, sputtering) and then add additional copper as needed by electrodeposition.
4. Deposit a conductive (metallic) seed-layer on the polymer film using electroless deposition techniques and then add additional copper as needed by electrodeposition.

Adhesiveless laminate 10 is laminated to a second layer 16 comprised of a sheet of conductive material 18 having a layer of adhesive 20 thereon. Layers 10 and 16 are then laminated to define a diclad laminate 22 which is shown in FIG. 2 and is comprised of outer conductive layers 14 and 18 sandwiching therebetween flexible polymeric films 12 and adhesive layer 20.

In the next step (see FIG. 3 and FIG. 7-B) through-holes 24 are drilled through laminate 22 in and conventional manner. It will be appreciated that the area between through-holes 24 is intended to be that area of the circuit laminate which will undergo dynamic flexing and so is identified in FIGS. 3-6 as the dynamic flex region "A". (However, it will be appreciated that the through-holes may be located at only one end of the circuit rather than on opposed ends as shown in the FIGURES). Thereafter, the sidewalls of through holes 24 are provided with conductive material via a conventional electroless plating technique (Step C). Usually the sidewalls will be provided with a layer of copper as identifed at 26. Thereafter, in a conventional and known manner, outer conductive layers 14 and 18 have circuit patterns formed therein using a substrative etching method. This method first calls for coating conductive layers 14 and 18 with a suitable etch resist followed by exposure and development of the resist pattern (Step D). Thus, referring to FIG. 4, the exposed and developed resist pattern shown at 28 and 29 corresponds to the desired circuit patterns 14' and 18'. It will be appreciated that lower circuit pattern 18' communicates between both through-holes 24 through dynamic flex region "A".

As shown in FIG. 5, outer layers of conductive material 14 and 18 are then etched to remove the conductive material between the etch resist 28 (Step E) and form circuit patterns 14' and 18'. The etch resist is then removed (Step F). Finally, the exposed copper areas in formed circuit patterns 14' and 18' are coated with a suitable adhesive 31 and then laminated to protective polymeric cover films 32 and 34 (Step G).

As shown in FIG. 6, after the manufacturing steps described hereinabove, the circuit paths of the dynamically stressed bending area e.g. dynamic flex region A, are located in the "neutral section" that is, in the area that is neutral with respect to the forces generated during bending; and the surface of the circuit board will be protected by a cover film 12 or 32, neither of which has any exposed adhesive layer. Moreover, the circuit shown in FIG. 6 is strictly symmetrical in its construction within the bending area "A". It will be appreciated that the final circuit shown in FIG. 6 is substantially similar to the final circuit achieved by using the method disclosed in U.S. Pat. No. 4,626,462. Accordingly, circuit 22 in FIG. 6 will have all of the features and advantages set forth in detail in that patent.

However, as can be seen from a review of FIG. 8, the first embodiment of the present invention as set forth in FIGS. 1-7 differs from the method disclosed in the prior patent in several important ways, particularly with respect to how the initial diclad laminate is made. Thus, the prior patent starts with a standard flex circuit material composed of copper foil 38 adhesively laminated to a polymeric film 40 via an adhesive layer 42; and then adds a second copper layer 44 by selectively adhering said copper foil to polymeric film 40 using a second adhesive 46. The partial adhesive layer is used in only non-flexing regions of the circuit (not in the dynamic flex region A). Thus, a characteristic of the method of the prior patent is that there is an air gap 48 formed between polymeric film 40 and second conductive layer 44 in the area containing the dynamic flexing section of the final product. In contrast, the process in accordance with the first embodiment of the present invention starts with an adhesiveless flex circuit 10 and adheres it to a second conductive layer and adhesive layer 12 as discussed hereinabove. The resultant diclad laminate 22 has only one adhesive layer (20) and no air gap (as in the prior patent). Thus, the present invention provides overall cost savings in terms of less adhesive as well as the preclusion of the formation and precise location of an air gap.

Referring simultaneously to FIGS. 9 and 18, in the second embodiment of the present invention, the manufacturing process initially utilizes a conventional single-sided circuit laminate comprised of a flexible polymeric film 52 adhesively attached to conductive foil 54 by a layer of suitable adhesive 56 (Step A). Next, laminate 50 has through holes 58 drilled therethrough (Step B). As in the first embodiment, the region between the through holes identified at "A" will comprise the dynamically stressed bending area which will eventually have circuit layers passing therethrough. (Also, as in the first embodiment, the through-holes may be located at only one end of the circuit rather than on opposed ends as shown in the FIGURES). Next, instead of electroless plating the through holes as in the first embodiment, copper or other conductive material is vacuum deposited (using conventional sputtering or evaporation techniques) into through holes 58 whereby a conductive seed-layer 60 having a thickness of from about 1,000–10,000 Angstroms, and preferably 2000–4000 Angstroms is deposited in the through-holes and on the polymer side of the substrate (Step C). Preferably, the laminate is initially plasma treated in gases which include, but are not limited to, nitrogen, oxygen, air, CF$_4$, argon, helium and ammonia. Next, as shown in FIG. 12, a circuit pattern is formed using conventional semi-additive methods whereby a photo resist layer 62 is provided onto the vacuum deposited conductive material 60. The photo resist is imaged and developed to define the desired pattern (Step D). Next, conductive material 64 such as copper is electrodeposited so that the circuit traces, pads and through holes are provided with additional conductive material (Step E). Plating resist 62 is then removed and the very thin layer (1–10,000 Å) of copper in the non-conductor area is flash etched to produce semi-additive circuit features on the seed-layer side (Steps F and G). The remaining conductive traces, paths, and through holes will thus be comprised of a layer of the very thin sputtered conductive material 62 having a thicker layer 64 of the electroplated material thereon (see FIG. 15).

Referring now to FIG. 16, etch resist is then applied to both sides of the circuit material followed by imaging and developing (Step H). Circuit patterns are then fabricated on the conductive side 54 of circuit material 50 using standard substractive processing techniques. The resist is stripped followed by lamination of non-conductive polymeric cover films 66 and 68 which are attached to circuit 50 using appropriate adhesive material 70 and 72 (Steps I–K).

As shown in FIG. 17, the manufacturing steps of the second embodiment described hereinabove will provide a multilayer circuit substantially similar to the multilayer circuit of FIG. 6 and of prior U.S. Pat. No. 4,626,462 wherein the circuit paths of the dynamically stressed bending area "A" are located in the "neutral section", that is in the area that is neutral with respect to the forces generated during bending; and the surface of the circuit are protected by covering films 66 and 68, neither of which has any exposed adhesive layers. Similarly, the cross section of the circuit board is strictly symmetrical in its construction within the bending area "A".

The method of the second embodiment of the present invention differs from the method of the first embodiment in that the second embodiment eliminates those steps related to the initial lamination to form a diclad circuit material. In addition, the second embodiment eliminates the electroless deposition operation and replaces it with a vacuum deposition (e.g. sputtering or evaporation) process. It will be appreciated that the vacuum deposition process eliminates the maintenance and environmental concerns associated with electroless deposition; and that the adhesion of the vacuum deposited seed-layer is greater than that of the electroless deposited seed-layer. Thus, the second embodiment may provide certain features and advantages over the first embodiment and so may be preferable.

It will also be appreciated that the second embodiment of the present invention differs from the process of prior U.S. Pat. No. 4,626,462 by elimination of the need for a diclad laminate and the use instead of a single sided laminate; and the use of a vacuum deposition technique rather than electroless plating technique for forming the initial conductive surface in the through holes. As in the first embodiment of the present invention, the second embodiment also dispenses with the need for the formation of a space or air gap and a layer of adhesive which is necessary in the method of the prior patent.

While the present invention has been discussed in terms of a two layer flexible circuit, it will be appreciated that the process described above in both of the embodiments can equally form a circuit having three or more layers.

Also, as in prior U.S. Pat. No. 4,626,462, the manufacture of the flexible circuits may be made continuous using punched sprocket holes and associated techniques as discussed in the prior patent.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of manufacturing a flexible circuit comprising:
   providing a circuit laminate comprising a first flexible non-conductive carrier film adhesively secured to a first conductive layer by a first layer of adhesive;
   forming at least two spaced through-holes in said circuit laminate with the area adjacent said through holes defining a bending region;
   vacuum depositing a thin layer of conductive material onto at least said first carrier film, and into said through holes;
   forming a first circuit pattern on said thin conductive layer vacuum deposited onto said first carrier film in a location outside of said bending region;
   forming a second circuit pattern from said first conductive layer, said second circuit pattern being located in at least a portion of said bending region; and
   removing the portion of said thin conductive layer vacuum deposited onto said first carrier film which is located in said bending region to thereby expose said first carrier film and removing the portion of said thin conductive layer vacuum deposited onto said first carrier film which is located between said first circuit pattern.

2. The method of claim 1 including the steps of:
   providing a second layer of adhesive to the first circuit pattern; and
   providing a first non-conductive cover film on said second layer of adhesive, said bending area being free of said second adhesive layer and said first cover film.

3. The method of claim 1 including the steps of:
   providing a second layer of adhesive to said second circuit pattern; and
   providing a first non-conductive cover film on said second layer of adhesive.

4. The method of claim 3 including the steps of:
providing a third layer of adhesive to said second circuit pattern and
providing a second non-conductive cover film on said third layer of adhesive.

5. The method of claim 1 wherein the step of forming through-holes comprises:
drilling through-holes through said circuit laminate.

6. The method of claim 1 wherein said step of forming said first circuit pattern comprises the steps of:
coating said thin conductive layer vacuum deposited onto said first carrier film with plating resist in locations other than corresponding to the pre-selected first circuit pattern;
exposing said plating resist pattern;
developing said etch resist pattern;
electrodepositing conductive material between said plating resist pattern in locations corresponding to the pre-selected first circuit pattern;
removing said developed plating resist pattern to expose said thin layer of vacuum deposited conductive material; and
flash etching said exposed thin layer of vacuum deposited conductive material.

7. The method of claim 1 wherein said step of forming said second circuit pattern comprises the steps of:
coating said first conductive layer with etch resist corresponding to the pre-selected second circuit pattern;
exposing said etch resist pattern;
developing said etch resist pattern;
etching said first conductive layer;
removing said developed etch resist pattern to expose said second circuit pattern.

8. The method of claim 1 including the step of:
vacuum depositing a thin layer of conductive material onto said first conductive layer.

9. The method of claim 7 including the step of:
vacuum depositing a thin layer of conductive material onto said first conductive layer.

10. The method of claim 9 including the step of:
etching said thin conductive layer vacuum deposited onto said first conductive layer prior to coating said first conductive layer with etch resist.

11. The method of claim 6 wherein said step of forming said second circuit pattern comprises the steps of:
coating said first conductive layer with etch resist corresponding to the pre-selected second circuit pattern;
exposing said etch resist pattern;
developing said etch resist pattern;
etching said first conductive layer;
removing said developed etch resist pattern to expose said second circuit pattern.

12. The method of claim 1 including the step of:
electrodepositing a layer of conductive material in said through holes over said thin sputtered conductive layer.

13. The method of claim 1 wherein:
said vacuum deposition steps comprise sputtering a thin layer of conductive material.

14. The method of claim 1 wherein:
said vacuum deposition steps comprise evaporating a thin layer of conductive material.

15. The method of claim 1 wherein:
said conductive material is copper.

16. A flexible circuit element formed in a method comprising the steps of claim 1.

* * * * *